Jan. 23, 1968 R. R. BUSS 3,365,676

AUTOMATIC FREQUENCY CONTROL SYSTEM AND METHOD FOR THE UNAMBIGUOUS AND PRECISE TUNING OF A HIGH-FREQUENCY TUNABLE OSCILLATOR

Filed Jan. 16, 1967 2 Sheets-Sheet 1

INVENTOR
ROBERT R. BUSS
BY Harvey G. [signature]
ATTORNEY

INVENTOR
ROBERT R. BUSS
BY
Harvey G. Lowhurst
ATTORNEY

United States Patent Office 3,365,676
Patented Jan. 23, 1968

3,365,676

AUTOMATIC FREQUENCY CONTROL SYSTEM AND METHOD FOR THE UNAMBIGUOUS AND PRECISE TUNING OF A HIGH-FREQUENCY TUNABLE OSCILLATOR

Robert R. Buss, Los Altos Hills, Calif., assignor to Alfred Electronics, Palo Alto, Calif., a corporation of California Filed Jan. 16, 1967, Ser. No. 609,611
17 Claims. (Cl. 331—11)

ABSTRACT OF THE DISCLOSURE

An automatic frequency control system and method for unambiguously and precisely tuning a high-frequency oscillator to any desired output frequency within a tuning range utilizing, sequentially or simultaneously, two reference frequency generators each of which provides an output frequency which is differently related to the desired output frequency. The two reference frequency generators are frequency locked to one another to maintain a fixed frequency relationship between them. One of the reference generators is adjustable and is tuned to have a harmonic which, when combined with the desired output frequency, differs therefrom by a fixed (IF) frequency. The other reference generator follows the one reference generator and provides a harmonic which differs from the harmonic of the one reference generator by twice the fixed (IF) frequency. By making the frequency difference between the signals supplied by the two reference generators different than the fixed (IF) frequency of the automatic frequency control system, unambiguous selection becomes possible.

BACKGROUND OF THE INVENTION

*Field of the invention*

This invention relates to automatic frequency control systems and methods and, more particularly, to a system and a method of tuning a high-frequency oscillator unambiguously and precisely to any desired output frequency within a large range of frequencies.

*Description of the prior art*

Heretofore, the most commonly used automatic frequency control system for controlling the frequency of the output signal from a high-frequency oscillator such as, for example, a klystron oscillator or a backward wave oscillator, utilizes a portion of the oscillator output signal for mixing with the output signal from a single reference generator, often referred to as the local oscillator, to develop an intermediate frequency signal of a fixed frequency which is, typically but not necessarily, 60 mHz. The intermediate frequency signal (IF signal) is passed through an IF amplifier to a phase sensitive detector (or to a frequency discriminator) which develops a direct current control voltage indicative of the error between the phase of the developed IF signal and an IF reference signal (or the error between the frequency of the developed IF signal and an IF reference signal). This control voltage is applied to a phase lock control circuit (or to a frequency control circuit) which, in turn, adjusts the frequency of the oscillator output signal to maintain a fixed frequency difference between the oscillator output signal and the reference generator signal. The frequency discriminator control system holds the frequency error to a small but finite value; the phase control system holds the phase error to a small but finite value, and since the phase error is the time integral of the frequency error, the phase control system holds the time integral of the frequency error to a small value rather than the frequency error itself, and hence is the more precise control system. The term "automatic frequency control system," as used herein, refers to a frequency control system or a phase lock control.

Such automatic frequency control systems are useful in applications in which the desired output signal from the high-frequency generator is to be constant, but the system has been found wanting for applications where it is desired to tune the high-frequency oscillator over a wide range and yet provide an accurately controlled output frequency. The problem with tuning such automatic frequency controlled oscillators is that since the IF signal frequency is about two orders of magnitude below the oscillator frequency, there is no assurance that the oscillator is actually tuned to the desired output frequency and not to one of the other possible nearby frequencies. This problem is further complicated when the local oscillator frequency is an order of magnitude below the desired output frequency, and a harmonic generator is employed to develop higher harmonics to obtain the required local oscillator frequency. In this case, many possible combinations of the harmonics with the IF frequency may satisfy the closed loop condition to produce many possible other frequencies than the desired output frequency.

The problem referred to is most readily explained in connection with a typical example. Assume that it is desired to tune a high-frequency oscillator to provide an output frequency of 1,940 mHz. Further assume that the automatic frequency control system for the high-frequency oscillator is set to maintain a fixed frequency difference of 60 mHz. If one now selects a local oscilaltor having a fixed frequency of 2,000 mHz., the high-frequency oscillator to be controlled will provide a 60-mHz. IF signal when it is tuned either to 1,940 mHz. or to 2,060 mHz. In order to avoid this ambiguity, it becomes necessary to provide a very sharp bandpass filter in the output circuit of the controlled oscillator. Such a filter is cumbersome and expensive to construct, attenuates the useful signal, and, more importantly, severely limits the tuning range of the controlled oscillator. Further, if the local oscillator provides a primary output signal of 200 mHz. and a harmonic generator is utilized to develop the necessary higher harmonics, there are additional output frequencies for the high-frequency generator which satisfy the frequency (or phase) lock condition, thereby further increasing the ambiguity. For example, each of the following additional frequencies in mHz. would satisfy the frequency (or phase) lock condition: 1,860, 1,740, 2,140, 2,260, just to name a few of the many possibilities.

It is, therefore, a primary object of this invention to provide an automatic frequency control system and method which removes the ambiguities pointed out hereinabove in connection with the prior art systems.

It is a further object of the present invention to provide an automatic frequency control system for a high-frequency oscillator which affords a wide tuning range and which can be accurately tuned to any frequency within the tuning range without any ambiguity.

It is still another object of the present invention to provide an improved tunable high-frequency oscillator which can be accurately tuned over a wide range of frequencies without any ambiguity, which is economical and reliable, and which provides advantages not realizable heretofore.

SUMMARY OF THE INVENTION

The objects of the present invention are realized by providing a second or auxiliary reference generator in addition to the normally used main reference generator and by sequentially or simultaneously applying the output signals from these two reference generators, as the local reference signals, to the mixer in the automatic frequency control system of the high-frequency oscillator. The two reference generators are frequency locked to one another to have a fixed frequency difference therebetween which bears a predetermined ratio to the frequency of the IF signal used in the automatic frequency control loop of the high-frequency oscillator, as determined by the harmonic relationship between the output signal from the reference generator and the desired output signal from the high-frequency oscillator. More particularly, the frequency difference between the two reference signals is selected to be $2f_i/N$ where $f_i$ is the fixed frequency difference maintained by an automatic frequency control system, and "N" is the particular harmonic of the reference signal utilized as the local oscillator signal.

Qualitatively, one reference generator provides a first picket fence of possible oscillator locking frequencies including the desired frequency which differs from the RF generator frequency by the IF signal, and the other reference generator provides a second picket fence of possible oscillator locking frequencies including the desired output frequency which differs from the second reference generator frequency by the same fixed amount and which therefore satisfy the condition of the automatic frequency controlled high-frequency oscillator. These two picket fences are so chosen as to have only a single overlapping picket within the tuning range which occurs at the desired output frequency.

The features of novelty that are considered characteristic of this invention are set forth with particularity in the appended claims. The organization and method of operation of the invention itself will best be understood from the following description when read in connection with the accompanying drawing in which:

DESCRIPTION OF THE PREFERRED EMBODIMENT

Figure 1:
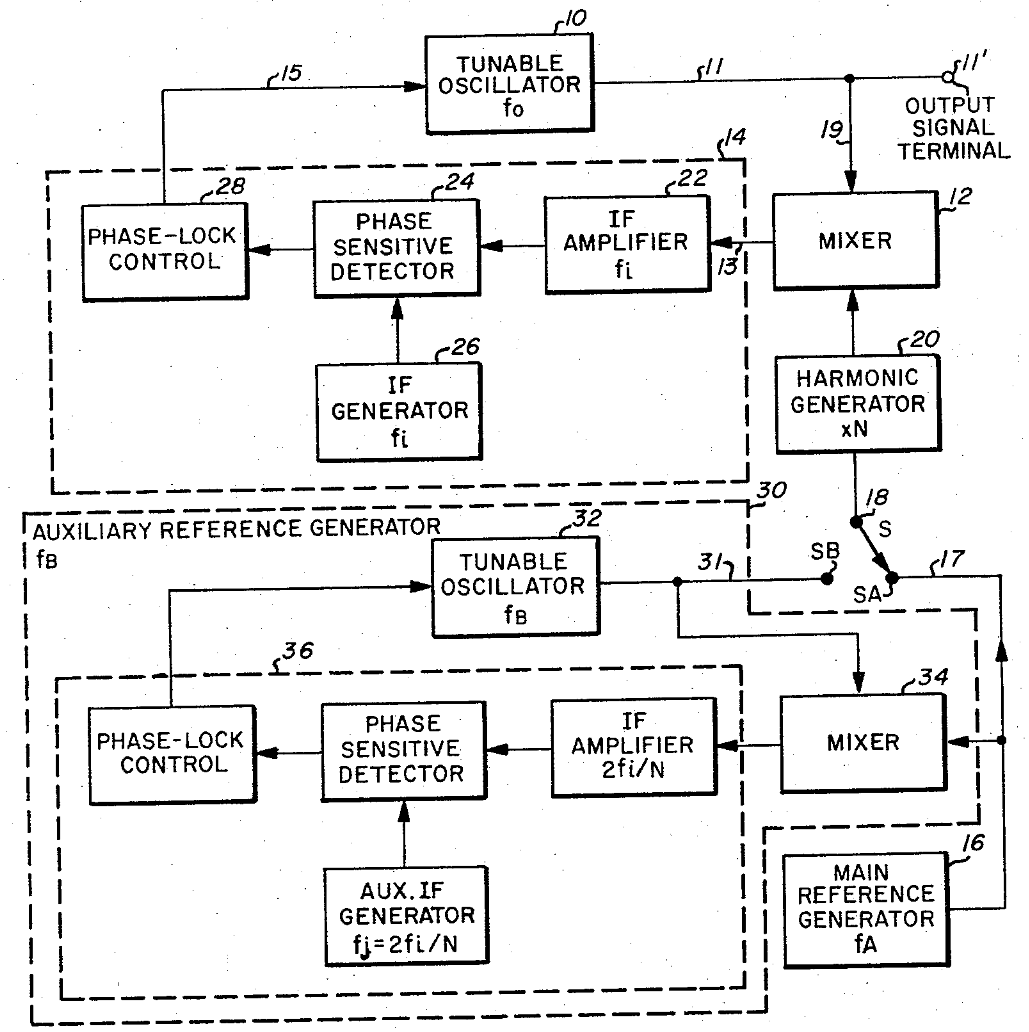
FIGURE 1 depicts a schematic block diagram of one embodiment of the automatic frequency control system of this invention in which the two reference generators are used sequentially.

Referring now to FIGURE 1, there is shown a voltage tunable oscillator 10, which may take the form of any conventional high-frequency oscillator, which provides an output signal having a frequency commensurate with the amplitude and polarity of a control signal on input lead 15. If oscillator 10 is a klystron, input lead 15 is connected to apply its signal to the repeller electrode, and if oscillator 10 is a backward wave oscillator, input lead 10 is connected to apply its signal to the helix or backward wave electrode. Oscillator 10 also has an output lead 11 which is coupled to output terminal 11' and to a coupling lead 19 by which a small fraction of the oscillator output signal is applied to one input terminal of a mixer 12. A mixer output lead 13 is connected to a frequency control feedback circuit 14 whose output terminal is connected to oscillator input lead 15. There is also provided an adjustable or main reference generator 16 whose output lead 17 is connected, through a switch 18 and a harmonic generator 20, to the other input terminal of mixer 12.

The combination of mixer 12, generators 16 and 20 and frequency control circuit 14 forms a conventional automatic frequency control system for oscillator 10 which maintains the frequency of the output signal for oscillator 10 such that the difference frequency on lead 13 (IF signal) remains constant.

Briefly, the operation of the automatic frequency control system described so far, and as applied to tuning oscillator 10, is as follows. Main reference generator 16 provides a signal of some given frequency, and tunable oscillator 10 is automatically tuned so that the difference between the frequency of a harmonic of this reference signal and of the output signal of oscillator 10 remains constant. This is accomplished by mixing the harmonics of the reference signal with the signal from oscillator 10 in mixer 12 to derive an IF signal. This IF signal is applied to frequency control circuit 14 which conventionally comprises an IF amplifier tuned to the IF signal. The amplified IF signal is then applied to a phase sensitive detector 24 which compares the frequency and phase of the derived IF signal with an internally generated IF signal supplied by a reference generator 26. Detector 24 derives a DC output signal commensurate with the integral of the frequency difference between the internally generated IF reference signal and the mixer developed IF signal which is applied, through a suitable phase lock control circuit 28, to lead 15 to tune oscillator 10 so that the mixer developed IF signal is in phase lock with the internally generated IF signal.

There is further shown an auxiliary reference generator 30 whose output lead 31 is connectible, through switch 18 and harmonic generator 20, to mixer 12. Switch 18 may be a simple double-throw type switch of the push button type so that, in one position, the signal from main reference generator 16 and, in the other position, the signal from auxiliary reference generator 30 is connected to mixer 12.

Auxiliary reference generator 30 comprises a tunable oscillator 32 having a mixer 34 and a frequency control circuit in its feedback loop to form an automatic frequency control circuit. The IF signal for controlling oscillator 32 is derived by mixing its output signal with the output signal from main reference generator 16. The so derived IF signal is applied to frequency control circuit 36 for automatic frequency control whose operation is, in all essential respects, similar to the one explained in connection with tunable oscillator 10.

Since the frequency of auxiliary reference generator 30 is controlled with reference to the frequency of main generator 16, it is immediately apparent that these two reference generators are frequency locked to one another and have output frequencies which differ by a fixed amount, namely, the IF frequency of the auxiliary reference generator. In accordance with the present invention, the frequency difference between the output frequencies of the two reference generators is selected to be equal to $2f_i/N$ where N is equal to the actual harmonic number of the signal from either reference generator which is utilized by mixer 12 to produce the fixed frequency difference used to control oscillator 10, and $f_i$ is the frequency difference itself.

Quantitatively, the theory of operation is that one reference generator supplies a harmonic which is higher than the desired output frequency by the fixed frequency difference used for automatic frequency control, and the other reference generator supplies a harmonic which is lower than the desired output frequency by the fixed frequency difference. Accordingly, the harmonics from the two reference generators must differ by an amount which is equal to twice the fixed frequency difference. The appropriate subharmonic for the frequency difference, therefore, is twice the fixed (IF) frequency divided by the harmonic number of the appropriate subharmonic. That this will result in an unambiguous frequency selection will now be derived.

Let the frequency of the oscillator output signal appearing on output lead 11 be $f_0$, the frequency of the main reference signal from reference generator 16 be $f_A$, the frequency of the auxiliary reference signal from reference generator 30 be $f_B$, the intermediate frequency of the automatic frequency control of oscillator 10 (reference generator 26) be $f_i$, the intermediate frequency of the automatic frequency control of reference generator 32 be $f_j$, and the actual harmonic of either reference generators 16 and 30 utilized by mixer 12 be "N."

Then, when switch 18 is in the position $S_A$ in which main reference generator 16 is connected to mixer 12, the output frequency from oscillator 10 is:

$$f_0 = Nf_A \pm f_i \quad (1)$$

When switch 18 is in the position $S_B$ in which auxiliary reference generator 30 is connected to mixer 12, the output frequency from oscillator 10 is:

$$f_0 = N'f_B \pm f_i \quad (2)$$

where N' may be a different harmonic than N.

The double condition given in either of Equations 1 or 2 are the general relations existing in any conventional phase locked loop such as those used in prior art. However, even if two oscillators are used as described here, the $\pm$ sign indicates a major spurious response possibility, and unambiguous lock is not yet assured. Prevention of the spurious response requires that the lock conditions be restricted such that only the lower (or upper) sideband of the mixing process in mixer 12 be used when the oscillator is locked to one reference generator, say generator 16, and that only the upper (or lower) sideband be used when the oscillator is locked to the second reference generator, say generator 30. Means for achieving the required restriction are described later below. Thus, Equations 1 and 2 have the $\pm$ ambiguity so resolved and become, respectively:

$$f_0 = Nf_A \mp f_i \quad (3)$$

$$f_0 = N'f_B \pm f_i \quad (4)$$

Since it is desired to have $f_0$ be the same value for switch 18 in either one of its two positions, it follows that:

$$Nf_A \mp f_i = f_0 = N'f_B \pm f_i \quad (5)$$

and from Equation 5 we see that:

$$Nf_A - N'f_B = \pm 2f_i \quad (6)$$

The desired conditions are that $N' = N = N_0$, the desired harmonic number, and so from Equation 6 the required relationship between $f_A$ and $f_B$ is:

$$f_A - f_B = \pm 2f_i/N \quad (7)$$

Accordingly, the difference between the frequencies of generators 16 and 32 must be equal $2/N$ times the frequency of the IF signal used for the control of oscillator 10, whatever the value of N and $f_i$. Of course, the value of N is readily ascertainable from the desired output frequency $f_0$ and the available reference generators. For example, if the desired center output frequency from oscillator 10 is 2,000 mHz. and the available adjustable reference generator 16 is tunable about a center frequency of 200 mHz., then N is equal to 10 and the frequency difference $f_A - f_B = \frac{1}{5} f_i$. Assuming that $f_i$ is equal to 60 mHz., the frequency difference between the main and auxiliary generator output signal of this invention is 12 mHz. This is, of course, the IF frequency of the auxiliary reference generator 30.

To check for spurious responses, the relationship of Equation 7 was inserted into Equation 6 from which it is found that for spurious responses to exist one has:

$$(N - N')f_A = 2f_i \left[1 - \frac{N'}{N_0}\right] \quad (8)$$

where $N_0$ is the desired harmonic number. Now as a practical matter, $2f_i$ is less than $f_A$, and also the only pertinent responses are those for values of N and N' near to the desired value $N_0$. The net result is that the only response of importance is the desired response for which $N = N' = N_0$.

Equation 7 is quite general, and discloses that as long as auxiliary reference generator 30 is phase locked to main reference generator 16 to maintain a frequency difference equal to $2/N$ times $f_i$, the output frequency of oscillator 10 is unambiguously tuned to $f_0$ as give by Equation 3.

It is also seen from Equation 1 that a change of $y$ cycles in the frequency $f_A$ of main reference generator 16 produces a change of $yN$ cycles in the output frequency $f_0$. Accordingly, if it is desired to change the frequency $f_0$ in steps of 2 cycles per second over a range extending from 1,800 mHz. to 2,200 mHz. with a main reference generator having a midfrequency of 200 mHz. ($N=10$) and selecting an IF frequency $f_i$ of 60 mHz., the main reference generator must be tunable from 186 mHz. to 226 mHz. in steps of one-fifth of a cycle per second. Since the difference in frequency between the reference generators 16 and 30 must be equal to $2f_i/N$, the IF frequency for tuning oscillator 32 is 12 mHz. It matters not which of generators $f_A$ and $f_B$ has its harmonic above $f_0$ and which has its harmonic below, so long as the appropriate single sideband selection is made.

In operating the present invention, generator 16 may be a standard frequency source of the digital type, or of any other type, which provides an output signal whose frequency is accurately known and adjustable. It is then adjusted in accordance with Equation 3 to provide an output signal from oscillator 10 of the desired frequency $f_0$. Thereafter, switch 18 is changed from contact $S_A$ to contact $S_B$. If no change in the control voltage on control lead 15 is observed, oscillator 10 provides a signal at the proper frequency. If a change in the control voltage on lead 15 is observed when switching from $S_A$ to $S_B$, this may be taken as an indication that oscillator 10 was oscillating at a frequency different from the desired frequency $f_0$, and a change in the setting for $f_0$ is required. By manipulating the switch back and forth between contacts $S_A$ and $S_B$ until no change in the voltage on control lead 15 is observed, the oscillator is tuned to the proper frequency $f_0$. Once oscillator 10 is known to oscillate at the desired frequency, its frequency can be changed by changing the frequency of main reference generator 16 without change of lock-on. In other words, no further switching is required until frequency lock-on is subsequently lost.

As started earlier, it is necessary to impose conditions that restrict the final lock conditions to allow lock only when the harmonic of one reference generator lies above the desired oscillator frequency, and when the similar harmonic of the second reference generator lies below the desired oscillator frequency. Thus, the system requires the suppression as far as control is concerned of the undesired sideband of the mixing process in mixer 12. The most elementary way to select the proper sideband is simply to approach the locking frequency relation in the proper direction; that is, if the lower sideband is desired, let the frequency of oscillator 10 be increased from just below the desired value. It is in general preferable to use more positive means of suppression. Such positive suppression can be achieved in either of two ways, both conventional. One way is actually to suppress the undesired sideband by a complex image cancelling mixer 12, such as is conventionally used in single sideband systems. The second method does not physically suppress the undesired sideband, but it does not permit lock to it. In this method, the output from a conventional frequency discriminator is first used to select the proper sideband before the phase discriminator is allowed to take over and complete the lock. With a frequency discriminator, should the oscillator frequency be positioned at the undesired sideband, an unstable situation exists that causes any slight frequency change to be amplified, driving the oscillator frequency away from this undesired point and causing the control system to go into a search mode until the desired frequency relationship is achieved.

If one does not restrict the lock to single sidebands as stated above, the composite locking process whereby $f_0$ is locked to both $f_A$ and $f_B$ is much more difficult to achieve, and unless the value of $f_i$ is also restricted to be significantly less than one-fourth the minimum value of $f_A$, there still remains a troublesome ambiguity. In particular, if we intend to have $Nf_A-f_i=f_0$ and $Nf_B+f_i=f_0$, but do not effectively suppress the undesired sidebands, we can have a possible spurious lock condition where $(N+1)f_B-f_i=Nf_A+f_i$. Such a spurious lock condition can thus occur for $(N+1)f_B-Nf_A=2f_i$ and since we have previously established $f_B=f_A-2f_i/N_0$, we have $(N+1)f_A-Nf_A-2(N+1)f_i/N_0=2f_i$, or:

$$f_A=(4N+2)f_i/N_0 \qquad (9)$$

In the example given above, where $N=N_0=10$ and $f_i=60$ mHz., a spurious lock condition can occur for $f_A=252$ mHz. and $f_B=240$ mHz.:

Desired $f_0=$
2460 mHz.=10 (240 mhz.)+60 mHz.
and
2460 mHz.=10 (252 mHz.)−60 mHz.
Spurious $f_0=$
2580 mHz.=11 (240 mHz.)−60 mHz.
and
2580 mHz.=10 (252 mHz.)+60 mHz.

If $f_i$ is restricted to have a value substantially smaller than one-fourth the minimum value of $f_A$, the spurious response conditions of Equation 9 cannot be satisfied unless the value of the harmonic giving the spurious response, N, is substantially larger than the desired value, $N_0$, and such a large frequency difference from the desired value then permits easy selection of the desired value. In any event, prior selection of the desired sideband considerably simplifies the search for the unambiguous composite lock conditions.

Figure 2:
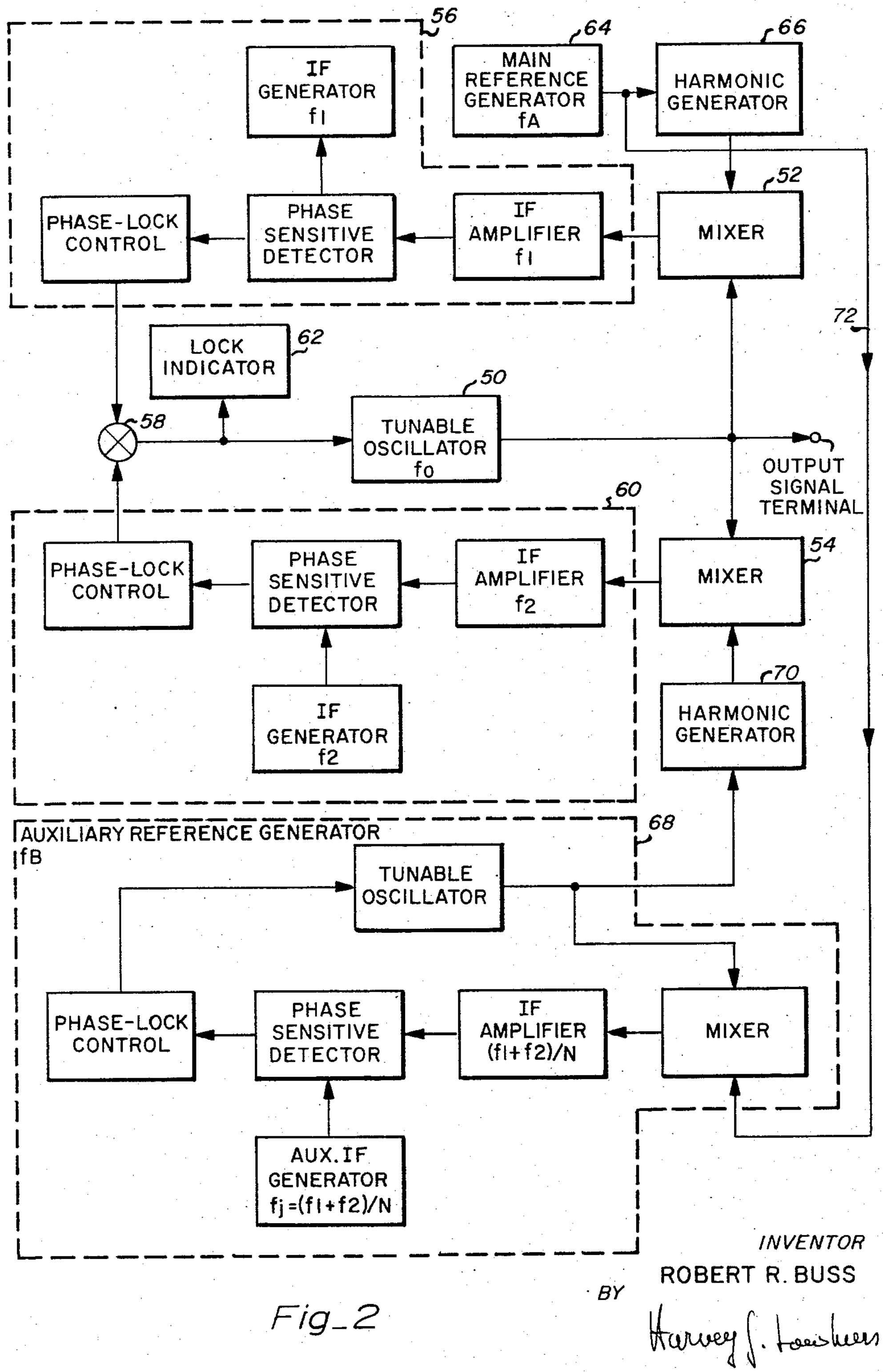
FIGURE 2 depicts a schematic block diagram of another embodiment of the automatic frequency control system of the invention in which the two reference generators are used simultaneously.

Referring now to FIGURE 2, there is shown a more generalized embodiment of the automatic frequency control system of this invention. As will become clearer from the ensuing description, the embodiment shown in FIGURE 1 is a special case of the generalized embodiment of the system shown in FIGURE 2. A tunable oscillator 50, which may be in all respects like oscillator 10 of FIGURE 1, has a portion of its output signal applied to a first mixer 52 and a second mixer 54. The output signal from first mixer 52 is applied to a first frequency control circuit 56 whose output signal (frequency control signal) is connected, through a suitable summing network 58, to the input terminal of oscillator 50. In a similar manner, the output signal from second mixer 54 is applied to a second frequency control circuit 60 whose output signal (frequency control signal) is also connected to summing network 58.

There is also provided a lock indicator means 62 which is connected to the lead between summing network 58 and the input terminal to oscillator 50. Lock indicator means 62 is an alternating current sensing device which indicates the absence of an alternating current component in the control signal applied to oscillator 50, this being a positive indication that oscillator 50 is in frequency lock with the frequency control circuits.

Frequency control circuits 56 and 60 may be similar in all respects to frequency control circuit 14 of FIGURE 1, and the arrangement so far shown comprises a pair of conventional automatic frequency control systems connected in parallel across tunable oscillator 50. Even though the IF reference frequencies provided by the IF reference generators included in frequency control circuits 56 and 60 may be the same, they are here shown as being respectively equal to $f_1$ and $f_2$.

An adjustable main reference generator 64, which may be similar in all respects to reference generator 16 of FIGURE 1, is connected through a suitable harmonic generator 66 to the other input terminal of first mixer 52. Similarly, an auxiliary reference generator indicated by reference numeral 68, which may be similar in all respects to reference generator 30 of FIGURE 1, is connected through a suitable harmonic generator 70 to the other input terminal of second mixer 54. The frequency of auxiliary reference generator 68 is controlled with reference to the frequency of main reference generator 64 through a connection 72 in the manner heretofore explained in connection with the control of auxiliary reference generator 30 of FIGURE 1 by main reference generator 16.

It can be shown, in the same manner used to derive Equation 7, that the condition for unambiguous lock-on is obtained when the frequency of main reference generator 64 is $(f_0 \pm f_1)/N$ and frequency difference between the output frequency from adjustable main reference generator 64 and the auxiliary reference generator 68 is equal to $$\frac{f_1+f_2}{N}$$

(the frequency of reference generator 68 being smaller), where $f_1$ and $f_2$ are the IF reference frequencies utilized respectively in frequency control circuits 56 and 60, $f_0$ is the desired output frequency and N is the harmonic number of the reference frequency utilized for the frequency control of oscillator 50.

It is readily seen that this condition for frequency lock-on reduces to the condition stated in Equation 7 for the special case where the IF reference frequencies $f_1$ and $f_2$ of frequency control circuits 56 and 60 are equal to one another and to $f_i$.

It is also readily seen that another special case of the circuit depicted in FIGURE 2 is obtained when the frequency $f_A$ of main reference generator 64 is selected to be equal to the desired oscillator ouput frequency $f_0/N$ in which case the output signal from first mixer 52 is applied to summing network 58 through a DC amplifier means which replaces frequency control circuit 56. In this case, the condition for phase lock is obtained by equating the intermediate frequency $f_1$ to zero so that the condition for frequency lock-on is obtained by selecting $f_A$ equal to $f_0/N$ and the difference between the frequency of main reference generator 64 and auxiliary reference generator 68 equal to $f_2/N$. This latter condition is obtained by making $f_1$ equal to zero.

There has been described an automatic frequency control system and method for unambiguously tuning a high-frequency oscillator to a desired frequency. Utilizing tunable main reference generator in the feedback loop of the oscillator to be tuned provides a picket fence of discreet frequencies which are achieved by phase lock with the IF frequency. Utilizing an auxiliary reference generator in the feedback loop of the oscillator to be tuned, either sequentially or simultaneously, possible phase lock with another discreet set of frequencies is obtained which provides a second picket fence. The two reference oscillators are interlocked in such a manner that the picket fences will have only a single spike at the same discreet frequency which obviates any ambiguity as to the frequency at which the high-frequency oscillator oscillates and allows tuning of the high-frequency oscillator.

What is claimed is:

1. An automatic, frequency controlled, tunable oscillator system comprising:

a tunable oscillator for providing an output signal of a selected frequency which is commensurate with a control signal;

a first reference generator accurately tunable throughout a selected range for providing a first subharmonic signal which is a known subharmonic of a first reference signal whose frequency differs from said selected frequency by a first predetermined amount;

a second reference generator for providing a second subharmonic signal which differs in frequency from said subharmonic signal by a second predetermined amount;

harmonic means for forming the harmonics of said first subharmonic and second subharmonic signals to respectively form said first reference signal and a second reference signal; and an automatic frequency control system including means responsive to said output signal and at least one of said reference signals and operative to derive said control signal which is commensurate with the frequency difference therebetween and said first predetermined amount for maintaining the frequency difference between said output signal and said reference signals equal to said first predetermined amount.

2. An automatic, frequency controlled, tunable oscillator system in accordance with claim 1 which further includes switch means operatively coupled to said automatic frequency control system for making said automatic frequency control system selectively responsive to one of said reference signals at a time.

3. An automatic, frequency controlled, tunable oscillator system in accordance with claim 2 in which the frequency of said second reference signal differs by twice said first predetermined amount from the frequency of said first reference signal.

4. An automatic, frequency controlled, tunable oscillator system in accordance with claim 2 in which the frequency of said second reference signal differs from the frequency of said output signal by said first predetermined amount and from the frequency of said first reference signal by twice said first predetermined amount.

5. A frequency controlled, tunable oscillator system in accordance with claim 2 in which said second predetermined amount is equal to twice said first predetermined amount divided by the harmonic number of the subharmonic of said first reference signal.

6. A frequency controlled, tunable oscillator system in accordance with claim 2 in which said second reference generator includes an automatic frequency control system including means responsive to said first and second subharmonic signals and operative to provide a further control signal for controlling said second reference generator for maintaining a frequency difference between said first and second subharmonic signals corresponding to said second predetermined amount.

7. A frequency controlled, tunable oscillator system in accordance with claim 6 in which said second predetermined amount is equal to twice said first predetermined amount divided by the harmonic number of the subharmonic of said first reference signal.

8. An automatic, frequency controlled, tunable oscillator system in accordance with claim 1 in which the frequency of said second reference signal is as much below the frequency of said output signal as the frequency of said first reference signal is above the frequency of said output signal.

9. An automatic, frequency controlled, tunable oscillator system comprising:

a tunable oscillator responsive to a control signal for providing an output signal of frequency $f_0$;

a first reference generator accurately tunable throughout a selected range for providing a first subharmonic signal of frequency $f_A$ which is the Nth subharmonic of a first reference signal whose frequency differs from said frequency $f_0$ by a first predetermined amount;

a second reference generator in frequency lock with said first reference generator for providing a second subharmonic signal of frequency $f_B$ which is the Nth subharmonic of a second reference signal whose frequency differs from said frequency $f_0$ by a second predetermined amount;

harmonic means for forming the Nth harmonics of said first subharmonic signal and second subharmonic signal to respectively form said first reference signal and said second reference signal;

a first automatic frequency control system including means responsive to said output signal and said first reference signal and operative to derive said control signal which is commensurate with the frequency difference therebetween and said first predetermined amount for maintaining the frequency difference between said output signal and said first reference signal equal to said first predetermined amount; and a second automatic frequency control system including means responsive to said output signal and said second reference signal and operative to derive said control signal which is commensurate with the frequency difference therebetween and said second predetermined amount for maintaining the frequency difference between said output signal and said second reference signal equal to said second predetermined amount.

10. An automatic frequency controlled, tunable oscillator in accordance with claim 9 in which the difference between said first and said second reference signals is equal to $(f_1+f_2)/N$ where $f_1$ and $f_2$ are respectively the first and the second predetermined amounts.

11. An automatic frequency controlled, tunable oscillator in accordance with claim 9 in which the frequency of said first subharmonic signal $f_A$ is equal to $(f_0 \pm f_1)/N$ and the frequency of said second subharmonic signal $f_B$ is equal to $(f_0 \mp f_2)/N$ where $f_1$ and $f_2$ are respectively the first and second predetermined amounts.

12. An automatic frequency controlled, tunable oscillator in accordance with claim 9 in which said first predetermined frequency difference is equal to zero and said second subharmonic signal differs from said first subhamonic signal by said second predetermined amount.

13. An automatic frequency controlled, tunable oscillator in accordance with claim 9 in which the frequency of said first reference signal is equal to $(f_0+f_1)$ and in which the frequency of said second subharmonic signal $f_B$ is equal to $$f_A - \frac{f_1+f_2}{N}$$

where $f_1$ and $f_2$ are respectively said first and second predetermined amounts.

14. A method for automatically controlling a tunable high-frequency oscillator to unambiguously provide an output signal of a selected frequency, comprising the steps of:

generating a first reference signal whose Nth harmonic differs from said selected frequency by a first predetermined amount;

generating a second reference signal whose Nth harmonic differs from said selected frequency by a second predetermined amount;

controlling the frequency of said second reference signal with respect to said first reference signal so that the difference in frequency between said first reference signal and said second reference signal remains constant and equal to a third predetermined amount which differs from said first and said second predetermined amounts;

forming the Nth harmonic of said first and second reference signals; and utilizing both the Nth harmonics of said first and second reference signals for controlling the frequency of said tunable high-frequency oscillator.

15. A method in accordance with claim 14 in which said first and second predetermined amounts are equal to one another and to $f_1$, and in which said third predetermined amount is equal to $2f_1/N$, and in which said first and said second reference signals are utilized sequentially.

16. A method in accordance with claim 14 in which said first predetermined amount is equal to $f_1$ and said second predetermined amount is equal to $f_2$, and in which said third predetermined amount is equal to $(f_1+f_2)/N$, and in which said first and said second reference signals are utilized simultaneously.

17. A method in accordance with claim 14 in which said first predetermined amount is equal to zero, and in which said second predetermined amount is equal to $f_1$, and in which said third predetermined amount is equal to $f_1/N$.

References Cited

UNITED STATES PATENTS

| | | | |
|---|---|---|---|
| 2,968,007 | 1/1961 | Hansen et al. | 331—11 |
| 3,136,956 | 6/1964 | Slonczewski | 331—14 |
| 3,319,178 | 5/1967 | Broadhead | 331—25 X |

ROY LAKE, *Primary Examiner.*

S. H. GRIMM, *Assistant Examiner.*